United States Patent [19]
Bodenweber et al.

[11] Patent Number: 5,898,311
[45] Date of Patent: Apr. 27, 1999

[54] SHORTING PAD HAVING A FLEXIBLE CONDUCTIVE SHEET

[75] Inventors: Paul Francis Bodenweber; Robert Charles Polacco, both of Kingston; Yuet-Ying Yu, Hopewell Junction, all of N.Y.

[73] Assignee: International Business Machines Corporation, Armonk, N.Y.

[21] Appl. No.: 08/761,168

[22] Filed: Dec. 6, 1996

[51] Int. Cl.⁶ .................................................. G01R 1/067
[52] U.S. Cl. .......................................... 324/754; 324/72.5
[58] Field of Search .................... 324/754–764, 324/72.5, 158.1; 439/86, 482

[56] References Cited

U.S. PATENT DOCUMENTS

| | | | |
|---|---|---|---|
| 3,068,403 | 12/1962 | Robinson | 324/72.5 |
| 4,389,610 | 6/1983 | Schiebel et al. | 324/72.5 |
| 4,922,192 | 5/1990 | Gross et al. | 324/754 |
| 4,963,225 | 10/1990 | Lehmqan-Lamer | 324/158.1 |
| 4,993,957 | 2/1991 | Shino | 324/754 |
| 5,134,364 | 7/1992 | Karpman et al. | 324/761 |
| 5,177,439 | 1/1993 | Liu et al. | 324/754 |
| 5,491,427 | 2/1996 | Ueno et al. | 324/754 |

OTHER PUBLICATIONS

L. Economikos, et al., "Electrical Test of Multichip Substrates", IRRR Transactions of Components, (Feb., 1994). Packaging, and Manufacturing Technology, Part B: Advanced Packaging, vol. 17, No. 1, Feb. 1994.

R. Eddy, et al., "High Speed Substrate Testing", pp. 1–16, (No Date).

*Primary Examiner*—Ernest F. Karlsen
*Attorney, Agent, or Firm*—Steven Capella

[57] ABSTRACT

A shorting pad probe tip for a substrate tester includes a compliant mandrel, a flexible conductive sheet and a nest plate. The flexible conductive sheet is loosely wrapped around the compliant mandrel. The compliant mandrel and flexible conductive sheet are secured together to the supporting nest plate. At least one side of the flexible conductive sheet is electrically conductive such that when the probe tip is brought in contact with the substrate to be tested, I/O pads on the surface of the substrate become electrically connected. In one embodiment the flexible conductive sheet is metallized polyimide.

12 Claims, 3 Drawing Sheets

SHORTING PAD HAVING A FLEXIBLE CONDUCTIVE SHEET

RELATED APPLICATION INFORMATION

This application relates to commonly owned concurrently filed U.S. patent application Ser. No. 08/761,167, entitled "Flexible Conductive Sheet".

FIELD OF THE INVENTION

This invention relates in general to integrated circuit testing apparatus and methods and more specifically to probes and methods for probing substrates.

BACKGROUND OF THE INVENTION

Integrated circuit chips may be packaged in a variety of ways depending upon the performance and reliability requirements of the system in which they are used. High end integration schemes, sometimes referred to as multichip modules (MCM) or single chip modules (SCM), normally include at least one integrated circuit chip which is mounted to an insulating substrate. The insulating substrate, which may be ceramic, for example, has one or more wiring layers and thus provides a medium for electrical connections between chips (on an MCM) and/or between modules (for MCM or SCM). The wiring layers of the substrate are terminated at each of the top and bottom surfaces of the substrate in an array of I/O pads for interfacing to the chip and to a circuit board or other higher level module. The I/O pads may be a part of a controlled collapse chip contact (C4), ball grid array (BGA) or other connection scheme.

Substrates are typically tested prior to chip attachment in order to locate wiring errors or manufacturing defects. Shown in FIG. 1 is an exemplary substrate tester 10. The substrate tester 10 includes a supporting base 12, upon which is mounted positioning means 14, upon which is mounted an I/O contact assembly 16. Disposed above the I/O contact assembly 16 is probe assembly 18 and positioning means 20. The substrate to be tested is received by the I/O contact assembly 16. The positioning means 14 can move the x-y location (e.g. horizontal position) of the I/O contact assembly 16 for aligning the I/O contact assembly 16 with the probe assembly 18. The positioning means 20 can move the probe assembly 18 in the z-direction (e.g. vertically) to raise and lower the probe assembly 18 with respect to the I/O contact assembly 16. Controllers 22 provide signals to control the movement of positioning means 14 and 20, apply test signals to the substrate through the I/O contact assembly 16 and/or probe assembly 18 and measure the results.

With reference to FIG. 2, there is shown in further detail a portion of an exemplary conventional probe 30 for testing a substrate 26 that has an array of I/O pads 28. The probe block 30a forms a part of the probe assembly 18 shown in FIG. 1 and has an array of probe pins 24 arranged to individually contact the I/O pads 28. The I/O contact assembly 16 contacts the I/O pads (not visible in FIG. 2) on the underside of the substrate 26. In order to test for shorts/opens in the substrate 26 predetermined voltage levels are selectively applied to the I/O pads on the underside of the substrate 26 via the I/O contact assembly 16; the output voltages at the I/O pads 28 are then measured by the probe 30.

The probe assembly 18 is an effective, but expensive means of testing substrates 26. Spacings between I/O pads 28 may be as small as 75 micrometers for state of the art substrates, and will likely be even smaller in the future. Thus, the spacing between the probe pins must be of a similarly small magnitude. Additionally, the accuracy to which the probe pins must be located within the probe 30 is extremely high. Such accuracies are quite difficult to achieve for machined or molded articles, and thus make the fabrication of the probe 30 and probe assembly 18 very expensive. Multiplying the expense is the need for a customized probe for each type of substrate tested (e.g. I/O pin array is very unlikely to be same for any two substrate designs). Additionally, aligning the probe to each substrate to be tested requires precise aligning means, such as an optical alignment system, which can add expense in terms of equipment cost an/or reduced throughput. If integrated into the substrate tester 10 such an alignment system significantly limits throughput. An alternative approach is to use a separate alignment system called a mapper, which speeds up processing time, but requires a greater equipment investment. Furthermore, changing the customized probes each time a different substrate is encountered also significantly limits tester throughput.

Shorting pads have been proposed as an alternative to the probe of FIG. 2, for the more limited purpose of testing for undesired opens in the substrate. A shorting pad can be formed from a conductive material which is placed across a plurality of the I/O pads in order to short them together during the test. Applicants have observed a variety of problems have occurred with the use of shorting pads. Breakage of substrates has been a problem with certain type of shorting pads, such as those relying on a piece of conductive cloth stretched across a supporting frame or block to make the connection between I/O pads, because the pressure required to provide acceptable electrical continuity has been excessive. Another alternative is to spread conductive paste on a substantially flat probe tip. However, the paste does not stay on the probe tip, thus requiring cleaning of each substrate tested and frequent reapplication of the paste to the probe tip. While conductive elastomer shorting pads have not resulted in breakage and are apparently cleaner than conductive paste, they have their own set of problems. The applicants have discovered that conductive elastomer shorting pads can leave behind a residue on the substrate which is not easily removed. The residue left behind can include metals, such as silver, which can cause reliability problems. Metals, particularly silver, can migrate over time, under certain voltage, temperature and humidity conditions, thereby forming dendritic growths which can bridge across conductors (e.g. such as I/O pads) which would otherwise be electrically isolated, thus shorting together the conductors. The residue can also include oil, such as silicone oil, which makes the I/O pads non-wettable, thus rendering the substrate unusable. The residue is extremely difficult to remove.

What is needed is a probe which overcomes the problems discussed hereinabove.

SUMMARY OF THE INVENTION

It is an object of the present invention to provide a method and apparatus for probing a substrate for receiving a chip.

It is an object of the present invention to provide a method and apparatus for shorting together I/O pads of a chip substrate.

It is a further object still of the present invention to provide a shorting pad for shorting together I/O pads of a chip substrate by making uniform and consistent contact between I/O pads of the chip substrate.

It is a further object still of the present invention to provide a shorting pad for shorting together I/O pads of a chip substrate without leaving a residue on the chip substrate.

In one embodiment the present invention is directed to shorting pad assembly which includes: a) a compliant mandrel; b) a base for supporting the compliant mandrel; and c) a flexible conductive sheet loosely wrapped around the compliant mandrel and secured to the compliant mandrel and to the base. The flexible conductive sheet may be a conductive cloth, silk screen or a metallized polymer. The compliant mandrel may be fabricated of an elastomeric material. The shorting pad assembly may be incorporated in a probe assembly of a substrate tester.

BRIEF DESCRIPTION OF THE DRAWINGS

The subject matter which is regarded as the invention is particularly pointed out and distinctly claimed in the concluding portion of the specification. The invention, however, may best be understood by reference to the following detailed description of the preferred embodiments and the accompanying drawings in which:

DETAILED DESCRIPTION OF THE PREFERRED EMBODIMENT

Figure 3:
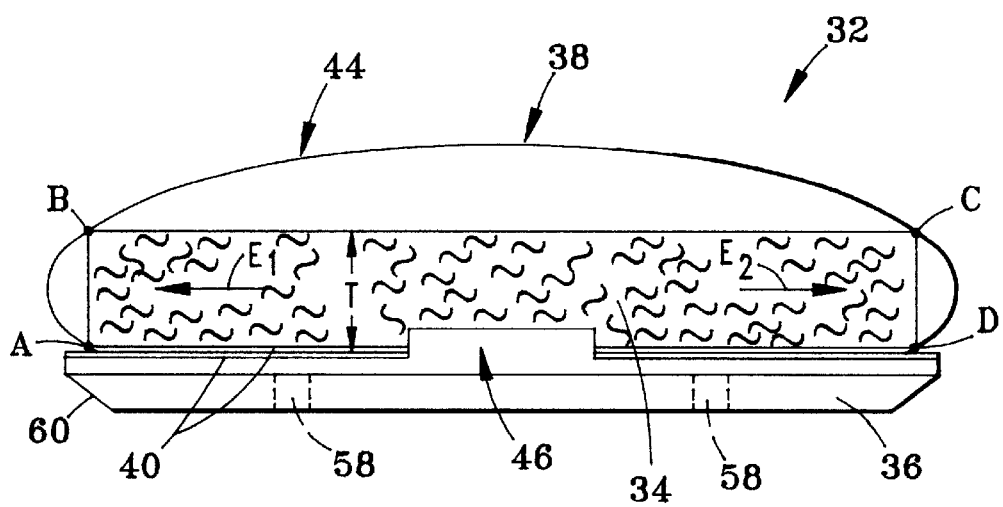
FIG. 3 depicts a shorting pad probe tip in accordance with the principles of the present invention.

With reference to FIG. 3, there is shown a preferred embodiment of a shorting pad probe tip 32 in accordance with the principles of the present invention. The probe tip 32 includes a compliant mandrel 34, a flexible conductive sheet 38 and a nest plate 36. The flexible conductive sheet 38, which is described in further detail hereinbelow, is loosely wrapped around the compliant mandrel 34. The compliant mandrel 34 and flexible conductive sheet 38 are secured together to a supporting nest plate 36. At least one side 44 of the flexible conductive sheet 38 is electrically conductive, which side 44 is facing out as shown in FIG. 3.

The compliant mandrel 34 is preferably formed from an elastomeric material, such as rubber, urethane or foam, so that the probe tip 32 returns to its original shape after undergoing compression. More preferably, the compliant mandrel is made of Poron® Urethane (Poron is a registered trademark of Rogers Corporation) commercially available from Rogers Corporation, located in East Woodstock, Conn. Poron Urethane is preferred because it has superior resilience and no tackiness has been experienced with it (e.g. it has not been found to stick to articles which it has been pressed against, nor has it been found to leave a residue on such articles).

The nest plate 36 supports the compliant mandrel 34 and provides a mechanism to attach the probe tip 32 to the probe assembly (not shown in FIG. 3). Nest plate 36 may also have a feature 46 for locating the compliant mandrel 34 and for limiting any unintentional slippage of the mandrel. The nest plate 36 can be made from a relatively rigid material. Metals or engineering plastics are preferable for their strength and convenience. In addition, it is also preferable that the material be ferromagnetic, as will become apparent hereinbelow. Gauge stock steel has been found to be a conveniently available and workable material which has the desired attributes of strength and ferromagnetism.

The flexible conductive sheet 38 can be secured to the compliant mandrel 34 by any of a variety of convenient methods, such as clips, screws or other fasteners (not specifically shown). Preferably, the flexible conductive sheet 38 is secured to the compliant mandrel 34 by an adhesive 40, such as an epoxy or glue, and more preferably by double-sided tape, so as to make the sheet 38 reusable and so as to make adjusting the slack of the conductive sheet 38 more convenient. The assembled flexible conductive sheet 38 and compliant mandrel 34 can be secured to the nest plate 36 in a similar manner.

As previously discussed, the flexible conductive sheet 38 is wrapped loosely around compliant mandrel 34 and has an amount of slack measured by the difference in the length L of flexible sheet that spans from one side of the compliant mandrel to the other side of the compliant mandrel 34 (e.g. point A to point D in FIG. 3) and the outer perimeter P of the compliant mandrel between the same two points (e.g. P=AB+BC+CD). The amount of slack S in the loosely wrapped conductive sheet is determined by the degree to which the compliant mandrel expands in the lateral direction as indicated by arrows $E_1$ and $E_2$ when under compression. In general, elastomeric materials may expand laterally by 30–120% of the thickness of the material. It is desirable that the slack S be of an amount sufficient that the compliant mandrel 34 can expand without putting the flexible conductive sheet 38 in tension. For example, for a compliant mandrel 34 made of a material that has a thickness T and that expands by 30% of the thickness, the length L desired for the flexible sheet would be greater than or equal to the sum: AB+BC+CD+0.3 T, thus providing a slack amount of S=0.3 T.

Figure 4:
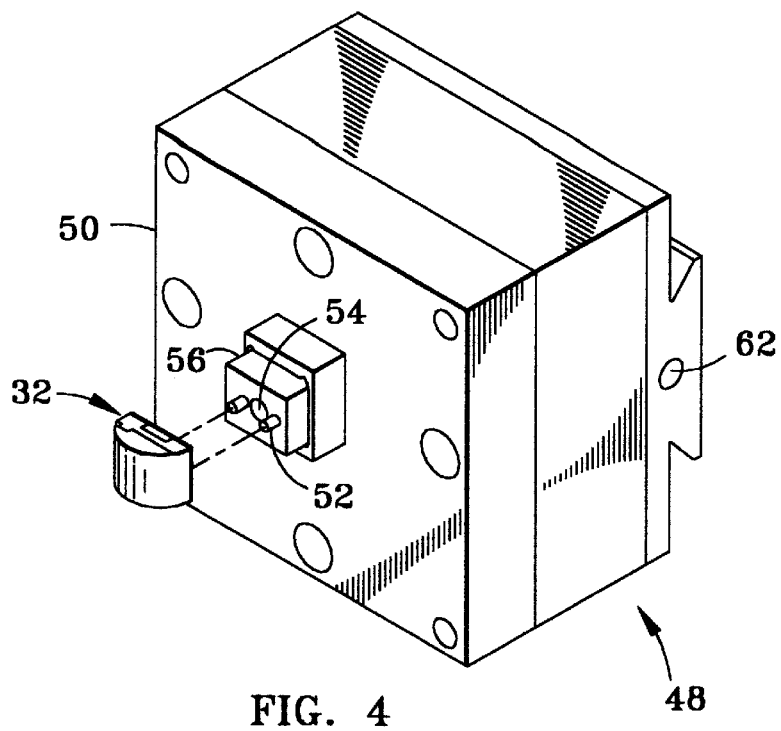
FIG. 4 depicts a probe including the shorting pad probe tip shown in FIG. 3 in accordance with the principles of the present invention.

With reference to FIG. 4, there is shown an exemplary embodiment of a probe 48 employing the shorting pad probe tip 32 of the present invention. The probe 48 includes a probe block 50 adapted for coupling to a substrate tester, for example, one similar to that described with reference to FIG. 1. Mounted on the probe block 50 is a z-motion block 56. The z-motion block 56 provides for a relatively small degree of motion in the z-direction (e.g. vertical direction as mounted on a tester) and applies a positive controlled force on the substrate under test. The z-motion block is adapted to apply a controlled force to the substrate to be tested. For example, the z-motion block 56 may include an air cylinder (not shown) coupled by air inlet 62, which air inlet 62 provides a passage for air to travel from the outside of the probe 48 through the probe material to the z-motion block 56, to a switch located in an external controller. Alternatively, a spring mechanism could also be used. The z-motion block 56 also includes a means for coupling the z-motion block 56 to the shorting pad probe tip 32. A pair of locating pins 52 extend from the bottom of the z-motion block 56 for mating to a matching pair of holes 58 in the nest plate 36 of the shorting pad probe tip 32 (see FIG. 3). A magnet 54 mounted to the z-motion block 56 holds in position the nest plate 36, which is ferromagnetic in this embodiment. The shorting pad probe tip 32 can be removed from the z-motion block 56 by prying. The edges 60 of the nest plate 36 are tapered to facilitate such removal.

Figure 1:
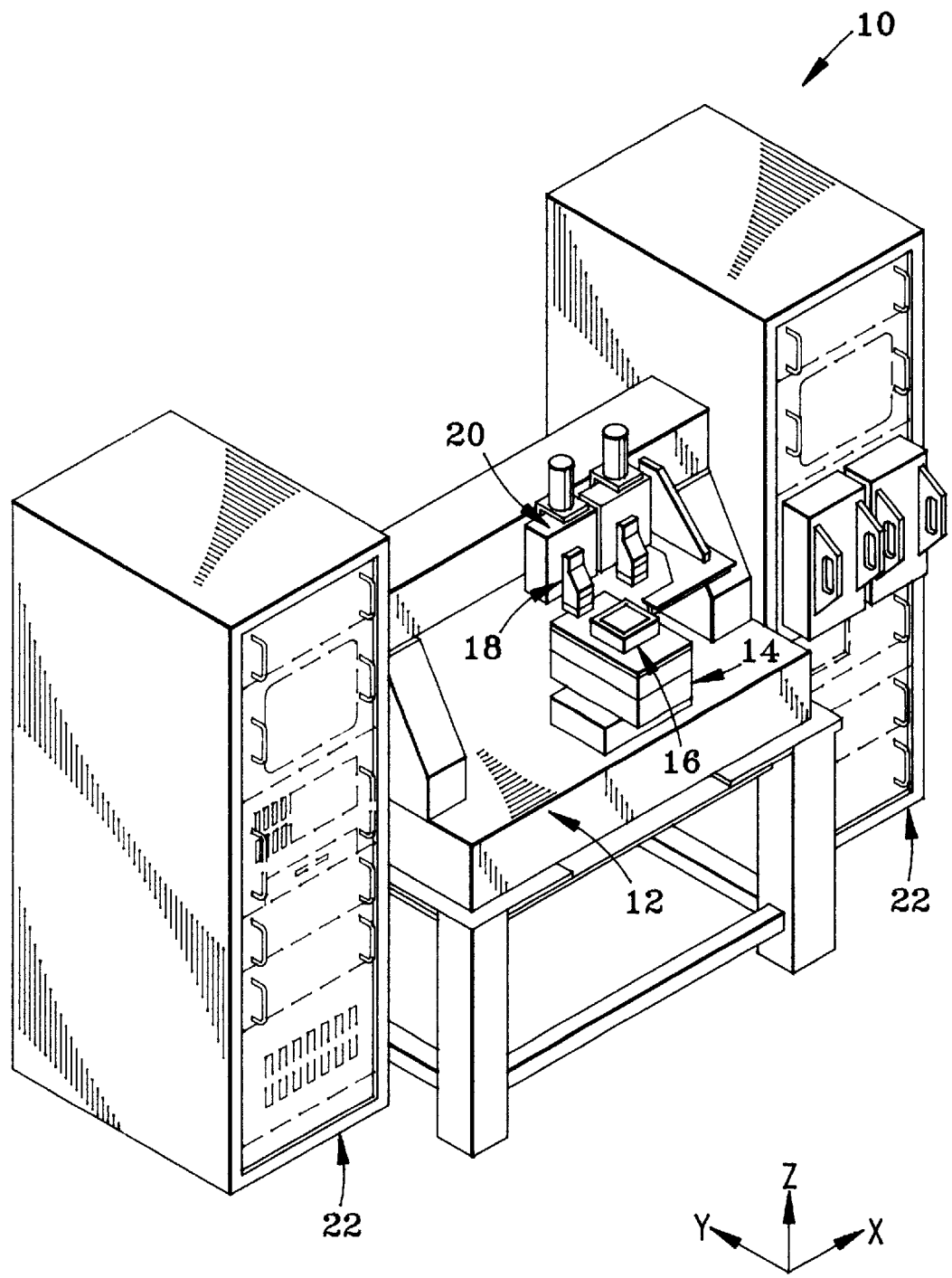
FIG. 1 is an exemplary substrate tester.

The probe 48 may be incorporated into a substrate tester similar to the substrate tester 10 shown in FIG. 1, in order to test for opens in the substrate. A substrate is first inserted into the I/O contact assembly 16. The positioning means 14 moves the I/O contact assembly 16 and substrate from a loading position to a test position such that the substrate is aligned with and located beneath the probe assembly 18. Positioning means 20 moves probe assembly 18, including probe 48, towards the substrate such that the flexible conductive sheet 38 is facing the substrate.

The z-motion block 56 of the probe 48 is then activated to move the shorting pad probe tip 32 further downwards towards the substrate, such that the flexible conductive sheet contacts the substrate surface. At this point of the downward motion, the compliant mandrel 34 has not come in contact with the substrate; the flexible conductive sheet 38, while in contact with the substrate, is freely moveable due to the slack provided therein. As the probe 48 continues to move downward, the compliant mandrel 34 contacts the flexible conductive sheet 38 and substrate and begins to compress under the force against the substrate. Because the slack provided in the way the flexible conductive sheet 38 is wrapped, the compliant mandrel is free to expand laterally under the compressive force. Thus the flexible conductive sheet 38 and compliant mandrel 34 conform to the I/O pads, shorting together the first plurality of I/O pads.

Next a voltage is applied to one or more of the I/O pads on the underside of the substrate through I/O contact assembly 16 and a voltage is measured at one or more of the I/O pads on the underside of the substrate. If the measured voltage is different than the applied voltage, that indicates that there is an open circuit in the substrate. After the voltage is measured, the probe 48 is raised, thus allowing the shorting pad probe tip 32 to return to its original shape such that it is ready for contacting a new substrate, and the I/O contact assembly 16 is moved to the loading position so that a new substrate may be tested.

The combination of the properties of the flexible conductive sheet 38 and the compliant mandrel 34 make the present invention advantageous for testing substrates. Because the flexible conductive sheet 38 is wrapped loosely around the compliant mandrel 34, the flexible conductive sheet 38 is free to move with respect to the compliant mandrel 34 during compression (e.g. during testing). Because the compliant mandrel has good energy absorption and excellent resilience, particularly when Poron Urethane is used, the flexible conductive sheet 38 makes conformal contact with the I/O array of the substrate with relatively low compressive forces, thus providing a uniformly good and repeatable contact with all the I/O pads. In addition, the compliant mandrel 34 and flexible conductive sheet 38 are durable, usable through many repetitions and can be used for a variety of substrates, thus improving throughput on the substrate tester.

The flexible conductive sheet 38 of the shorting pad 32 of the present invention can take several forms. For example, it can be a metallized polymer film, an example of which is discussed in further detail below. Alternatively, conductive cloth, for example bound loop conductive cloth, which is commercially available from Swift Textile Metal in Broomfield, Conn., can also be used in conjunction with the present invention on substrates having a lower density of I/O pads or relatively large I/O features (e.g. such as those which would be used with wire bonded integrated circuits) without suffering the disadvantages experienced in the past (e.g. it will conform to the I/O pads or other I/O features without excessive force). In addition, various silk screens (e.g. very fine wire meshes) can also be used. Silk screens are advantageous in that the knuckles, that is the locations where wires intersect, can penetrate surface oxides that may be present on the I/O pads, thus insuring a good contact.

Figure 5:
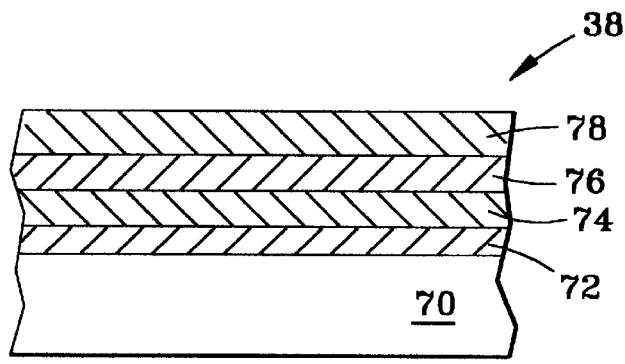
FIG. 5 is a flexible conductive sheet in accordance with the principles of the present invention.

With reference to FIG. 5, a preferred embodiment of the flexible conductive sheet 38 will now be described in further detail. The flexible conductive sheet includes a flexible base layer 70, which is preferably a polymeric film, and more preferably a polyimide, such as Kapton® Polyimide Film (Kapton is a registered trademark of Du Pont Company) commercially available from Du Pont Company, located in Wilmington, Del. The thickness of the base layer can range from approximately 8 to 50 microns, and is preferably in the range 13 to 25 microns. The applicants have found that the thickness of the base layer 70 is important. If the base layer 70 is too thin, it cannot provide adequate support to the overlying layers. If the base layer 70 is too thick, the flexible conductive sheet 38 may not have the desired flexibility.

Upon the base layer 70 are disposed several layers, preferably metal, which cooperate to provide adhesion to the Kapton, stress reduction and/or electrical conductiveness. Layer 72 is disposed over base layer 70 so as to provide adhesion of the other layers to the base layer 70. Layer 72 preferably comprises a 100 to 300 Å layer of Chromium (Cr) and more preferably comprises a 200 Å layer of Cr. Layer 74 is disposed over layer 72 and is provided as a softening agent to reduce stress in adjacent layers. Layer 74 preferably comprises a 10,000 to 60,000 Å layer of copper (Cu), and more preferably comprises a 52,000 Å layer of Cu. Layer 76 is disposed over layer 74 and is provided as a diffusion barrier to prevent intermetallic interactions, and more particularly to prevent diffusion of layer 74 from diffusing to outer layers. Layer 76 preferably comprises a 5000 Å to 30,000 Å layer of nickel and more preferably comprises a 20,000 Å layer of nickel. A final layer 78 is disposed over layer 76 and is provided to protect the underlying layers from oxidation and to provide low contact resistance. Layer 78 preferably comprises a 200 to 1000 Å layer of gold (Au) and more preferably comprises a 350 Å layer of Au.

Figure 6:
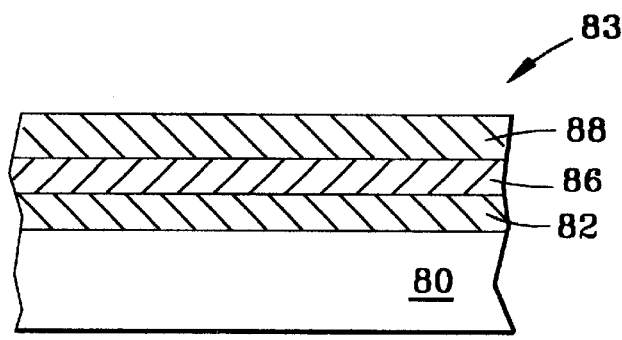
FIG. 6 is a flexible conductive sheet in accordance with the principles of the present invention.

Applicants have discovered that it may not always be necessary to include a softening agent, depending on the thickness of the other layers, thus allowing omission of layer 54. Applicants have found that by increasing the relative thicknesses of layers 56 (e.g. the diffusion barrier layer) and 78 (e.g. the final layer), layer 74 is not required. For example, with reference to FIG. 6, the flexible conductive sheet 83 may comprise layers 80, 82, 86 and 88. Layer 80 is preferably a polymeric film, and more preferably a polyimide, such as Kapton having a thickness ranging from approximately 8 to 50 microns, and preferably approximately 13 microns. Layer 82 is disposed on layer 80 and preferably comprises a 100 Å to 300 Å layer of chromium, and more preferably comprises a 200 Å layer of chromium. Layer 86 is disposed on layer 82 and preferably comprises a 15,000 Å to 60,000 Å layer of nickel, and more preferably comprises a 22,500 Å layer of nickel. Layer 88 is disposed on layer 86 and preferably comprises a 200 Å to 2,500 Å layer of gold, and more preferably comprises a 1000 Å layer of gold.

The exemplary layers described above can be formed on the base layer by a variety of deposition methods including sputtering, and more preferably, evaporation methods. Because the base layer is relatively thin, it should be supported in some way prior to the deposition operation. For example, it can be held flat by means of a vacuum, or can be stretched across a frame. Since deposition methods are well known in the art, the details of the processing will not be discussed herein, for a person of ordinary skill in the art would understand from the disclosure contained herein how to make such a flexible conductive sheet 83.

Figure 2:
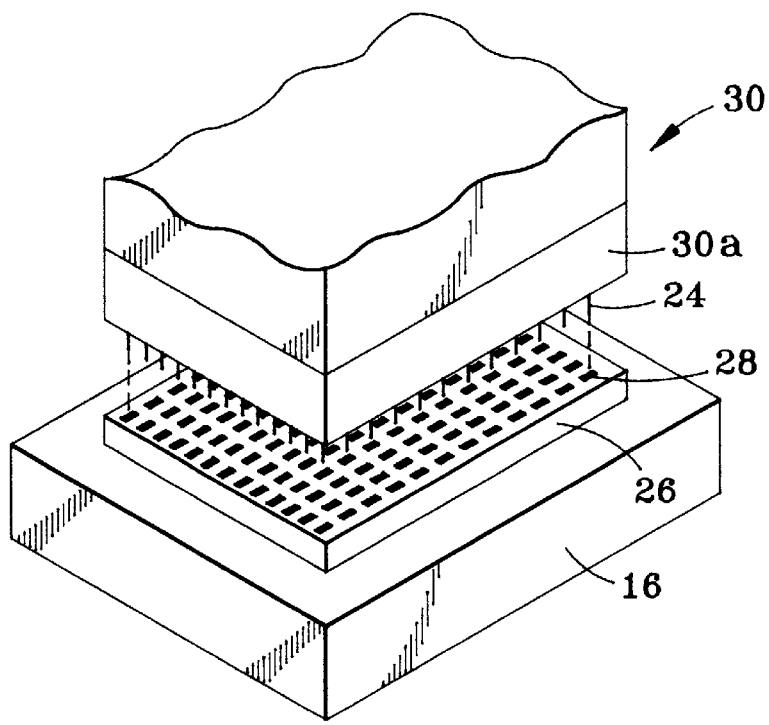
FIG. 2 is a schematic depiction of a portion of a conventional probe usable with the substrate tester shown in FIG. 1.

The present invention enjoys various advantages over prior art approaches. The flexible conductive sheet 38, particularly the embodiment described with reference to FIG. 5, is both flexible and resilient, and is mounted on the compliant mandrel 34 in such a way that it retains these properties, such that it will conform to an article having a topography, but returns to its original shape after the compression is removed. In addition, it has very low contact resistance, offering consistently good electrical conditions. Further, the shorting pad probe tip 32 of the present invention is simple and relatively inexpensive to fabricate, as compared to the type of probe discussed with reference to FIG. 2. Still further, the shorting pad probe tip 32 of the present invention allows for much simpler methods of aligning the probe to the substrate to be tested, since each I/O pad is not individually contacted. In addition, while the flexible conductive sheet 38 shown in FIG. 5 has been described in terms of a particular application, a person of ordinary skill in the art would recognize other uses for the flexible conductive sheet 38. For example, it could be used as an electrical field shield for electronic components or other electrical parts. Such a shield could be used to contain electrical noise due to radio frequency interference (RFI).

While the invention has been particularly shown and described with reference to preferred embodiments thereof, it will be understood by those skilled in the art that various other changes in form and detail may be made therein without departing from the spirit and scope of the invention.

What is claimed is:

1. A shorting pad assembly comprising:
   a compliant mandrel;
   a base for supporting the compliant mandrel; and
   a flexible conductive sheet loosely wrapped around the compliant mandrel and secured to the compliant mandrel and to the base, said loosely wrapped flexible conductive sheet includes an amount of slack which allows the compliant mandrel to expand while under compression without putting the flexible conductive sheet in tension.

2. The shorting pad assembly as recited in claim 1 wherein the flexible conductive sheet is secured to the compliant mandrel and to the base by an adhesive.

3. The shorting pad assembly as recited in claim 2 wherein the adhesive comprises double-sided tape.

4. The shorting pad assembly as recited in claim 1 wherein the flexible conductive sheet comprises silk screen.

5. The shorting pad assembly as recited in claim 1 wherein said mandrel has a thickness measured from said base, the slack amount is approximately 30% to 120% of the thickness of the compliant mandrel.

6. The shorting pad assembly as recited in claim 1 wherein the flexible conductive sheet comprises a metallized sheet of polyimide.

7. The shorting pad assembly as recited in claim 6 wherein the flexible conductive sheet comprises a sheet of polyimide covered with gold.

8. The shorting pad assembly as recited in claim 6 wherein the flexible conductive sheet comprises a sheet of polyimide underlying a layer of chromium, the chromium layer underlying a layer of nickel, the nickel underlying a layer of gold.

9. The shorting pad assembly as recited in claim 6 wherein the flexible conductive sheet comprises a sheet of polyimide underlying a layer of chromium, the chromium layer underlying a layer of copper, the copper underlying a layer of nickel, the nickel underlying a layer of gold.

10. The shorting pad assembly as recited in claim 1 wherein the flexible conductive sheet comprises conductive cloth.

11. The shorting pad assembly as recited in claim 1 wherein the compliant mandrel is an elastomeric material.

12. The shorting pad assembly as recited in claim 11 wherein the compliant mandrel comprises urethane.

* * * * *